(12) United States Patent
Zhao et al.

(10) Patent No.: US 8,867,254 B2
(45) Date of Patent: Oct. 21, 2014

(54) FLEXIBLE MEMORY AND ITS FABRICATION PROCESS

(71) Applicant: Nanjing University, Nanjing (CN)

(72) Inventors: Yi Zhao, Nanjing (CN); Yi Shi, Nanjing (CN); Xiangdong Ye, Nanjing (CN)

(73) Assignee: Nanjing University, Nanjing (CN)

( * ) Notice: Subject to any disclaimer, the term of this patent is extended or adjusted under 35 U.S.C. 154(b) by 0 days.

(21) Appl. No.: 13/955,292

(22) Filed: Jul. 31, 2013

(65) Prior Publication Data

US 2014/0169081 A1    Jun. 19, 2014

(30) Foreign Application Priority Data

Dec. 13, 2012 (CN) .......................... 2012 1 0538715

(51) Int. Cl.
*G11C 5/02* (2006.01)
*H01L 43/14* (2006.01)
*H01L 43/06* (2006.01)

(52) U.S. Cl.
CPC ............. *H01L 43/14* (2013.01); *H01L 43/06* (2013.01)

USPC ............................... 365/51; 365/158; 365/55

(58) Field of Classification Search
USPC ............... 365/51, 158, 55, 66; 257/686, 40, 257/E21.665; 438/3, 46
See application file for complete search history.

(56) References Cited

U.S. PATENT DOCUMENTS 6,504,742 B1 * 1/2003 Tran et al. ....................... 365/51

* cited by examiner

*Primary Examiner* — David Lam
(74) *Attorney, Agent, or Firm* — Treasure IP Group

(57) ABSTRACT

This invention describes the structure and the fabrication method of a flexible memory. The flexible memory includes eight layers. The three function layers are a flexible layer of hall unit, a flexible layer of horizontal lines, and a flexible layer of vertical lines. The main fabrication process of the flexible memory includes the following: the function layers are made on the hard substrates by the traditional nano-micro methods, and then the function layers are transferred on the flexible substrates, finally the whole layers are packaged to form the flexible memory.

4 Claims, 5 Drawing Sheets

FLEXIBLE MEMORY AND ITS FABRICATION PROCESS

CROSS REFERENCE TO RELATED APPLICATION

This application claims priority to, Chinese Application No. 201210538715.3, filed on Dec. 13, 2012, entitled "A Flexible Memory and Its Fabrication Process". The Chinese Application is incorporated herein by reference in its entirety.

TECHNICAL FIELD

This invention belongs to electronic products and manufacturing technology fields, and it promulgates the structure of a kind of flexible memory and its fabrication process. The memory has the advantages of high flexibility, high storage density, simple structure, and low manufacturing and material costs.

BACKGROUND

Magnetoresistance random access memory (MRAM) possesses excellent characteristics such as high-integrated level, non-volatility, high speed of read-write ability, almost unlimited read-write cycles, low power waste, and anti-irradiation ability. MRAM can be used either as an internal memory or as an external storage. As an internal memory, MRAM has the advantages of non-volatility, high speed of read-write ability and anti-irradiation compared to the Dynamic Random Access Memory (DRAM). As an external storage, MRAM has the advantages of high speed of read-write ability, low power waste, and long working life compared to current standard flash memory. MRAM also has the advantages of having no moving elements compared to hard disc and as easy to use as flash memory. In order to adapt to the traditional lithography process, currently published MRAM fabrication usually is constructed on the hard substrates such as silicon or aluminum-base alloy. Because of the hardness of the substrates, this MRAM has much higher stiffness which results in much lower shock resistance, higher breakability, and lower portability.

SUMMARY OF INVENTION

This invention proposes a flexible memory with high storage density. The memory adapts the flexible materials as the substrates and transfers the flexible layer of functional devices on the substrates by the transfer process, resulting in the flexible memory.

In order to fabricate the memory, this invention adapts the following technical proposals:

A kind of flexible memory with super-high storage density includes two flexible substrates. Above the first substrate there are six layers in turn: a flexible layer of hall unit, an adhesive layer, a flexible layer of horizontal lines, an adhesive layer, a flexible layer of vertical lines, an adhesive layer. A second flexible substrate covers the inner layers.

The characteristic of the fabrication of the above flexible memory has the following steps:

(1) A layer of photoresist is uniformly coated on the surface of the silicon dioxide of a silicon substrate by either spin-coating or spraying.

(2) A transparent mold containing the topography of hall unit is imprinted in the photoresist and an ultraviolet light is introduced to cure the shaped photoresist. After peeling off the mold, the reverse structure of hall unit will be formed in the photoresist.

(3) A layer of material for hall unit is deposited on the reversed structures of the photoresist by the physical vapor deposition, and the hall unit will be formed on the silicon dioxide of the silicon substrate by the following lift-off process.

(4) A layer of polymethyl methacrylate (PMMA) is coated on the surface of the hall unit by either spin-coating or spraying. After the solvent of PMMA is vaporized by heating, there will be a film of PMMA containing hall unit left on the surface of the silicon dioxide substrate.

(5) After removing the silicon dioxide by wet etching, a hall unit coated with the PMMA is obtained, resulting in the flexible layer of hall unit.

(6) After the first alignment, the flexible layer of hall unit is transferred on the flexible substrate. A layer of adhesive is coated on the flexible layer of hall unit and then the hall unit is fixed by curing the adhesive layer.

(7) The flexible layer of horizontal lines is obtained by repeating steps (1) through (5), with the exception of the mold with the topography of hall unit in step (2) been replaced with another mold containing the topography of horizontal lines, and the deposited material in step (3) been replaced with the line material.

(8) After the second alignment, the flexible layer of horizontal lines is transferred on the flexible layer of hall unit, with a layer of adhesive coated on the flexible layer of horizontal lines and the horizontal lines fixed by curing the adhesive layer.

(9) The flexible layer of vertical lines is obtained by repeating steps (1) through (5), with the exception of the mold with the topography of hall unit in step (2) been replaced by another mold containing the topography of vertical lines, and the deposited material in step (3) been replaced with the line material.

(10) After the third alignment, the flexible layer of vertical lines is transferred on the flexible layer of horizontal lines, with a layer of adhesive coated on the flexible layer of vertical lines, and a flexible substrate covered on the flexible layer of the vertical lines; After curing of the adhesive layer, the whole flexible memory fabrication process is completed.

DETAIL DESCRIPTION

Figure 1:
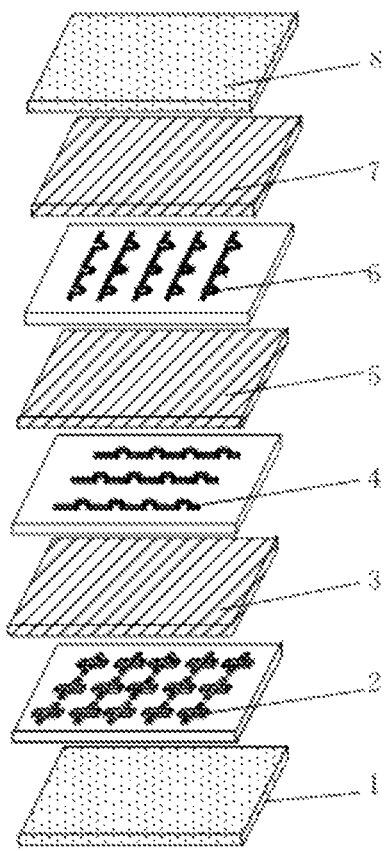
FIG. 1 is a schematic diagram of the structure of an exemplar flexible memory in accordance with the present invention.

The attached FIG. 1 is the schematic diagram of the structure of the flexible memory. The tags in FIG. 1 represent the following materials respectively: tag 1 is the flexible substrate (such as the polycarbonate or polydimethyl siloxane); tag 2 is the flexible layer of hall units (such as the commercial ferro-platinum); tag 3 is the adhesive layer (such as the polydimethyl siloxane); tag 4 is the flexible layer of horizontal lines (such as the commercial aluminum or argentum); tag 5 is the adhesive layer (such as the polydimethyl siloxane); tag 6 is the flexible layer of vertical lines (such as the commercial aluminum or argentum); tag 7 is the adhesive layer (such as the polydimethyl siloxane); and tag 8 is the flexible substrate (such as the polycarbonate or polydimethyl siloxane).

Figure 2A:
FIGS. 2a, 2b, and 2c are schematic diagrams of the mold containing a topography of hall unit, in accordance with the present invention.
Figure 2B:
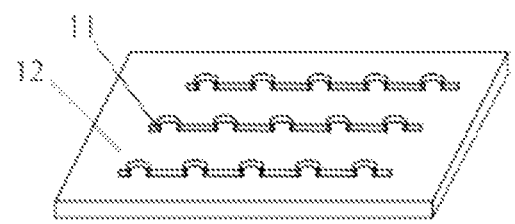
Figure 2C:

FIGS. 2a, 2b, and 2c are the schematic diagrams of the mold containing the topography of hall unit, the mold containing the topography of horizontal lines, and the mold containing the topography of vertical lines, respectively. In these three figures, tags 9, 11 and 13 are the topography of hall unit, horizontal lines, and vertical lines, respectively. Tags 10, 12 and 14 are the backing support of the molds (such as materials of quartz or glass).

Figure 2D:
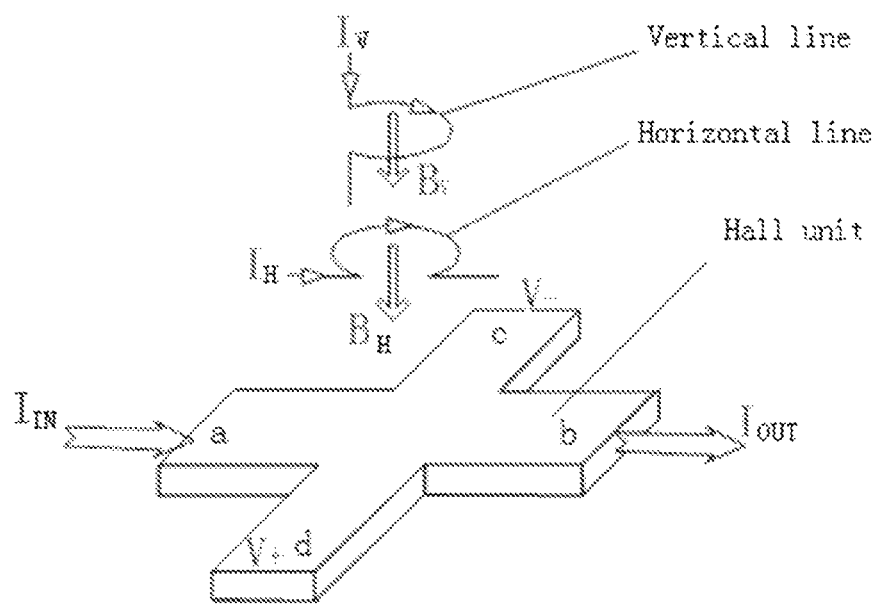
FIG. 2d is the schematic diagram of the flexible memory's operating principle.

FIG. 2d is the schematic diagram of the flexible memory's operating principle. As shown in the figure, when the messages are written, the horizontal lines and the vertical lines have the currents of IH and IV, respectively; the vertical components of the strength of the magnetic field caused by the currents of IH and IV are BH and BV, respectively; under the summarized effects of BH and BV, the central active regions of the hall units are excited, resulting in the messages being written in the memory.

When the messages are read from the memory, electric currents are sent to the two electrodes of the hall units so that electric potential difference is induced into the other two electrodes of the hall units. The induced electric potential difference corresponds to the remanence condition of the patterned magnetic medium, so the written messages are read out. The IIN and $I_{OUT}$ represent the currents flowing in the hall units and flowing out from the hall units, respectively. $V_+$ and $V_-$ represent the electric potentials induced from the electrodes of in the hall units, respectively.

FIG. 3 illustrates the fabrication process of the flexible memory's storage unit. As shown in FIG. 3, tag 1 denotes silicon substrate, tag 2 denotes a sacrificial layer of silicon dioxide, letter A denotes the photoresist, tag 3 denotes the hall unit, letters B, C and D denote the PMMA, tag 4 denotes the flexible substrate, tags 5, 7 and 9 denote the adhesive layers, tag 6 denotes the layer of horizontal lines, tag 8 denotes the layer of vertical lines, and tag 10 denotes the flexible substrate.

Figure 3A:
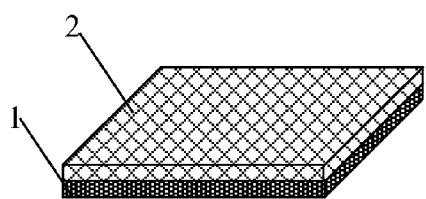
FIG. 3a illustrates the silicon substrate with a sacrificial layer of silicon dioxide.
Figure 3B:
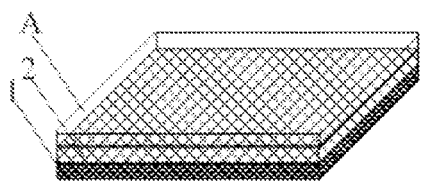
FIG. 3b illustrates the spaying of the photoresist on the sacrificial layer of the silicon dioxide.
Figure 3C:
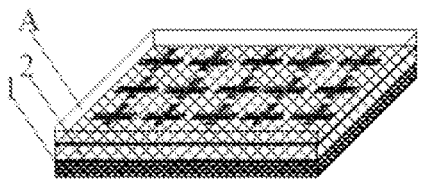
FIG. 3c illustrates the making of the reversed layer by the mold with the patterns of the hall units.
Figure 3D:
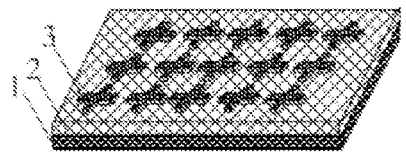
FIG. 3d illustrates the process of obtaining the hall units with the lift-off steps.
Figure 3E:
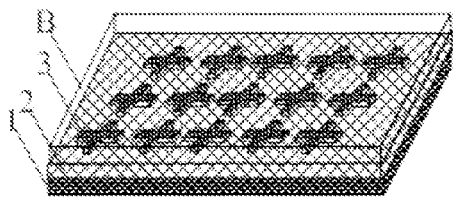
FIG. 3e illustrates the process of coating PMMA.
Figure 3F:
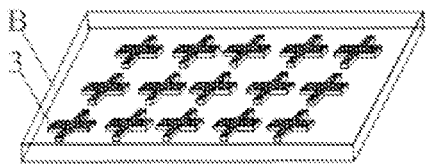
FIG. 3f illustrates the process of obtaining the flexible layer of hall units by removing the sacrificial layer of the silicon dioxide.
Figure 3G:
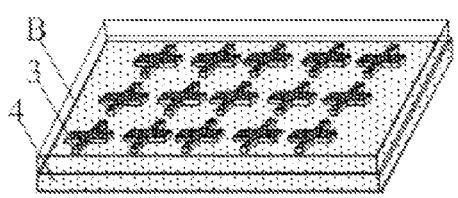
FIG. 3g illustrates the process of transferring the flexible layer of the hall units on the flexible substrate.
Figure 3H:
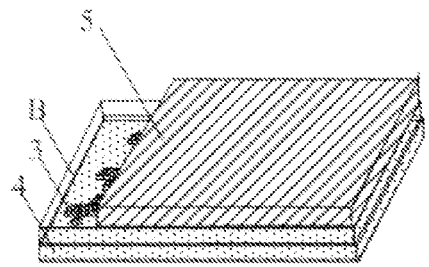
FIG. 3h illustrates the coating of the adhesive layer on the flexible layer of the hall units.
Figure 3I:
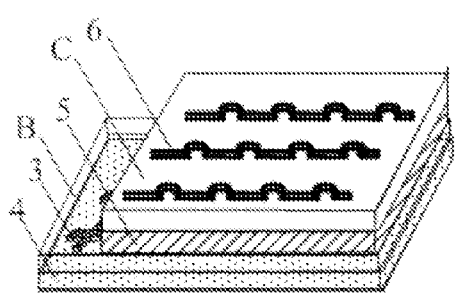
FIG. 3i illustrates the transfer of the flexible layer of the horizontal lines on the layer of adhesive.
Figure 3J:
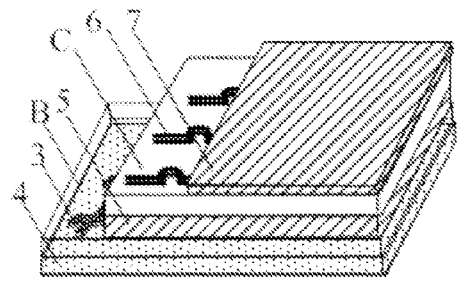
FIG. 3j indicates the coating of the adhesive layer on the flexible layer of the horizontal lines.
Figure 3K:
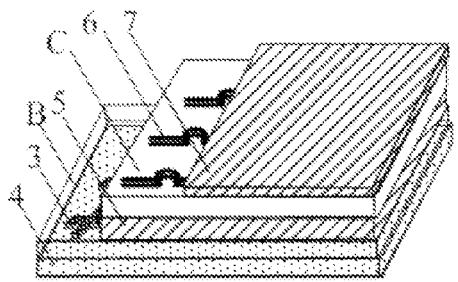
FIG. 3k indicates the transfer of the flexible layer of the vertical lines on the layer of adhesive.
Figure 3L:
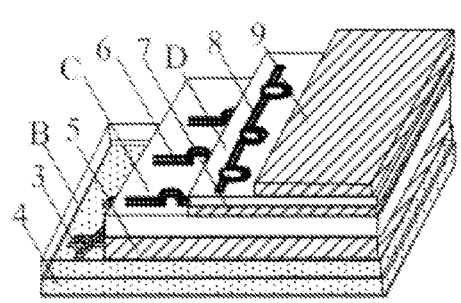
FIG. 3l indicates the coating of the adhesive layer on the flexible layer of the vertical lines.
Figure 3M:
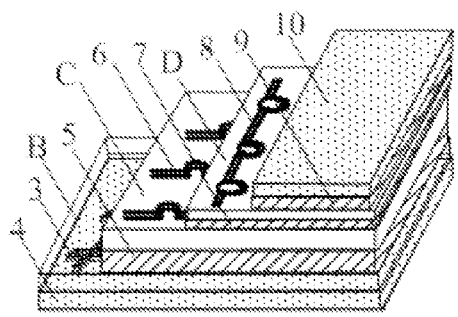
FIG. 3m indicates covering the adhesive layer with the flexible substrate.

FIG. 3a illustrates the silicon substrate with a sacrificial layer of silicon dioxide. FIG. 3b illustrates the spaying of the photoresist on the sacrificial layer of the silicon dioxide. FIG. 3c illustrates the making of the reversed layer by the mold with the patterns of the hall units. FIG. 3d illustrates the process of obtaining the hall units with the lift-off steps. FIG. 3e illustrates the process of coating PMMA. FIG. 3f illustrates the process of obtaining the flexible layer of hall units by removing the sacrificial layer of the silicon dioxide. FIG. 3g illustrates the process of transferring the flexible layer of the hall units on the flexible substrate. FIG. 3h illustrates the coating of the adhesive layer on the flexible layer of the hall units. FIG. 3i illustrates the transfer of the flexible layer of the horizontal lines on the layer of adhesive. FIG. 3j indicates the coating of the adhesive layer on the flexible layer of the horizontal lines. FIG. 3k indicates the transfer of the flexible layer of the vertical lines on the layer of adhesive. FIG. 3l indicates the coating of the adhesive layer on the flexible layer of the vertical lines. FIG. 3m indicates covering the adhesive layer with the flexible substrate.

The following section illuminates the invention in detail with the use of some drawings and examples by the inventors.

The configuration of the flexible memory is described as following:

The memory is made of eight layers, including flexible substrate 1. On top of the flexible substrate 1, the layers are (in turn): a flexible layer of hall unit 2, an adhesive layer 3, a flexible layer of horizontal lines 4, an adhesive layer 5, a flexible layer of vertical lines 6, an adhesive layer 7, and another flexible substrate 8. The hall unit is a kind of mnemonic unit with hysteresis effect.

The fabrication of the above flexible memory has the following steps (illustrated in FIG. 3):

(1) A layer of photoresist A is uniformly coated on the surface of the silicon dioxide 2 of a silicon substrate 1 by either spin-coating or spraying.

(2) A transparent mold containing the topography of hall unit is imprinted in the photoresist, and an ultraviolet light is introduced to cure the shaped photoresist. After peeling off the mold, the reverse structure of the hall unit is pressed in the photoresist. (as shown in FIG. 2a)

(3) A layer of material for hall unit (such as the commercial ferroplatinum) is deposited on the reversed structures of the photoresist by the physical vapor deposition, and the hall unit 3 will be formed on the silicon dioxide 2 of the silicon substrate by the following lift-off process.

(4) A layer of polymethyl methacrylate B is coated on the surface of the hall unit 3 by spin-coating or spraying. After the solvent of PMMA is vaporized by heating, there will be a film of PMMA containing hall unit 3 left on the surface of the silicon dioxide substrate 2.

(5) After removing the silicon dioxide 2 by wet etching (such as the diluted fluorhydric acid), the hall unit packaged by the PMMA is obtained, which is the flexible layer of hall unit in the FIG. 3f.

(6) After the first alignment, the flexible layer of hall unit is transferred on the flexible substrate 4 (such as the polycarbonate or polydimethyl siloxane). A layer of adhesive 5 is coated on the flexible layer of hall unit and then the hall unit is fixed by curing the adhesive layer.

(7) The flexible layer of horizontal lines is obtained by repeating steps (1) through (5), with the exception of the mold with the topography of hall unit in step (2) been replaced by another mold containing the topography of horizontal lines, and the deposited material in step (3) changed to the line material (such as commercial aluminum or argentum).

(8) After the second alignment, the flexible layer of horizontal lines is transferred on the adhesion layer 5, with a layer of adhesive (such as the polydimethyl siloxane) coated on the flexible layer of horizontal lines and the horizontal lines fixed by curing the adhesive layer.

(9) The flexible layer of vertical lines is obtained by repeating steps (1) through (5), with the exception of the mold with the topography of hall unit in step (2) been replaced by another mold containing the topography of vertical lines, and the deposited material in step (3) changed to the line material.

(10) After the third alignment, the flexible layer of vertical lines is transferred on the flexible layer of horizontal lines, with a layer of adhesive coated on the flexible layer of vertical lines, and a flexible substrate covered on the flexible layer of the vertical lines; After curing of the adhesive layer, the whole flexible memory fabrication process is completed.

We claim:

1. A flexible memory with super-high storage density, consisting of six layers in between two flexible substrates, consisting
    a first flexible substrate;
    a flexible layer of hall unit, deposited on top of the first substrate;
    a first adhesive layer, formed on top of the flexible substrate layer;
    a flexible layer of horizontal lines, positioned on top of the first adhesive layer;
    a second adhesive layer, coated on top of the flexible layer of horizontal lines;
    a flexible layer of vertical lines, formed on top of the second adhesive layer;
    a third adhesive layer, coated on top of the flexible layer of vertical lines; and
    a second flexible substrate, positioned on top of the third adhesive layer,
    wherein the hall unit is a kind of mnemonic unit with hysteresis effect.

2. A process to fabricate the flexible memory of claim 1, comprising
    (1) spin-coating or spraying a layer of photoresist uniformly on a surface of the silicon dioxide of a silicon substrate;
    (2) imprinting a transparent mold containing a topography of hall unit in the photoresist and introducing an ultraviolet light to cure the shaped photoresist; forming a reverse structure of hall unit in the photoresist after peeling off the mold;
    (3) depositing a layer of material for hall unit on the reverse structure of the photoresist by the physical vapor deposition, and forming the hall unit on the silicon dioxide of the silicon substrate by the following lift-off process;
    (4) coating a layer of polymethyl methacrylate (PMMA) on the surface of the hall unit by either spin-coating or spraying; evaporating the solvent of PMMA by heating and forming a film of PMMA containing hall unit on the surface of the silicon dioxide substrate;
    (5) obtaining a hall unit coated with the PMMA and achieving a flexible layer of hall unit, after removing the silicon dioxide by wet etching;
    (6) transferring the flexible layer of hall unit after a first alignment, onto the flexible substrate; coating a layer of adhesive on the flexible layer of hall unit and then fixing the hall unit by curing the adhesive layer;
    (7) achieving a flexible layer of horizontal lines by repeating steps (1) through (5), with the exception that the mold with the topography of hall unit in step (2) is replaced with another mold containing the topography of horizontal lines, and the deposited material in step (3) is replaced with a line material;
    (8) transferring a flexible layer of horizontal lines on the flexible layer of hall unit after a second alignment, with a layer of adhesive coated on the flexible layer of horizontal lines and the horizontal lines fixed by curing the adhesive layer;
    (9) obtaining the flexible layer of vertical lines by repeating steps (1) through (5), with the exception that the mold with the topography of hall unit in step (2) is replaced by another mold containing the topography of vertical lines, and the deposited material in step (3) is replaced with a line material; and
    (10) transferring the flexible layer of vertical lines onto the flexible layer of horizontal lines, after a third alignment, with a layer of adhesive coated on the flexible layer of vertical lines, and a flexible substrate covered on the flexible layer of the vertical lines; curing of the adhesive layer and completing the process of fabricating a whole flexible memory.

3. The process of claim 2, wherein the photoresist possesses negative resist.

4. The process of claim 2, wherein the flexible substrates and all the molds have alignment marks.

* * * * *